(12) United States Patent
Furge

(10) Patent No.: US 8,050,418 B2
(45) Date of Patent: Nov. 1, 2011

(54) UPDATE SYSTEM FOR AN AUDIO AMPLIFIER

(75) Inventor: Kenneth Carl Furge, Howell, MI (US)

(73) Assignee: Harman International Industries, Incorporated, Northridge, CA (US)

( * ) Notice: Subject to any disclaimer, the term of this patent is extended or adjusted under 35 U.S.C. 154(b) by 1875 days.

(21) Appl. No.: 11/176,607

(22) Filed: Jul. 7, 2005

(65) Prior Publication Data

US 2007/0009108 A1    Jan. 11, 2007

(51) Int. Cl.
*H04B 1/00*    (2006.01)

(52) U.S. Cl. ............... 381/86; 381/28; 381/120; 330/2; 330/136

(58) Field of Classification Search .......... 381/86, 381/26, 28, 120; 330/2, 136
See application file for complete search history.

(56) References Cited

U.S. PATENT DOCUMENTS

| | | | |
|---|---|---|---|
| 4,176,323 A | 11/1979 | Odell | 330/263 |
| 4,613,974 A * | 9/1986 | Vokac et al. | 375/259 |
| 5,160,896 A | 11/1992 | McCorkle | 330/251 |
| 5,289,378 A | 2/1994 | Miller et al. | 364/424.04 |
| 5,590,161 A * | 12/1996 | Meyn et al. | 375/368 |
| 5,732,074 A | 3/1998 | Spaur et al. | 370/313 |
| 5,819,227 A | 10/1998 | Obuchi | 705/1 |
| 5,936,667 A | 8/1999 | Saib et al. | 348/180 |
| 5,940,346 A * | 8/1999 | Sadowsky et al. | 367/128 |
| 6,009,363 A | 12/1999 | Beckert et al. | 701/33 |
| 6,032,089 A | 2/2000 | Buckley | 701/36 |
| 6,263,084 B1 | 7/2001 | Cressman et al. | 381/164 |
| 6,279,153 B1 | 8/2001 | Bi et al. | 717/11 |
| 6,316,992 B1 | 11/2001 | Miao et al. | 330/2 |
| 6,804,504 B1 * | 10/2004 | Johnson et al. | 455/344 |
| 2002/0000831 A1 * | 1/2002 | Smith | 326/39 |
| 2003/0084107 A1 * | 5/2003 | Covey | 709/206 |
| 2003/0179161 A1 * | 9/2003 | Yamamoto | 345/60 |
| 2004/0143828 A1 * | 7/2004 | Liu et al. | 717/168 |
| 2004/0260416 A1 * | 12/2004 | Kellom et al. | 700/94 |
| 2005/0132792 A1 * | 6/2005 | Lemense et al. | 73/146.4 |
| 2007/0089109 A1 * | 4/2007 | Fontijn | 717/177 |

FOREIGN PATENT DOCUMENTS

| | | | |
|---|---|---|---|
| EP | 1 168 883 A2 | | 1/2002 |
| EP | 1471524 | * | 2/2004 |
| EP | 1 471 524 A1 | | 10/2004 |
| WO | WO 2005/024622 A2 | | 3/2005 |

* cited by examiner

*Primary Examiner* — Vivian Chin
*Assistant Examiner* — Paul Kim
(74) *Attorney, Agent, or Firm* — Brinks Hofer Gilson & Lione (57) ABSTRACT

A system and method for updating the software of a digital audio amplifier. The digital data used to update the amplifier's software is transmitted as an analog signal over analog audio channels to the amplifier. The amplifier is adapted to recognize when an audio signal should be used to update the amplifier's software, instead of merely driving the speakers with the audio signal. Upon receiving such an audio signal, the amplifier decodes the analog signal into digital instructions. The digital instructions are processed to reconfigure the amplifier's operation.

54 Claims, 6 Drawing Sheets

UPDATE SYSTEM FOR AN AUDIO AMPLIFIER

BACKGROUND OF THE INVENTION

1. Technical Field

The present invention relates to vehicle audio systems. More particularly, the invention relates to a system and method for updating the software of a digital amplifier after installation in a vehicle.

2. Related Art

A typical vehicle audio system includes a head unit, an amplifier and speakers. The head unit may have several audio devices, such as a CD (compact device) player, a radio tuner, a tape player and an MP3 player. Typically, the head unit outputs an analog audio signal to the amplifier. The amplifier can control the volume, balance, tone and distortion limits, fade and equalization parameters of the audio signal. In addition, the amplifier drives the speakers with the audio signal.

In recent years, consumer expectations regarding the performance of vehicle audio systems have increased. This has resulted in an increased use of digital amplifiers. Digital amplifiers typically have a digital signal processor ("DSP") to provide digital processing of audio signals received from the head unit. The DSP provides audio processing features, such as delay, surround decoding, non-causal filters and fast equalization updates.

However, digital amplifiers contain software that may need to be updated. For example, an amplifier may need a software update to enhance its operation or fix a flaw discovered after the start of production. A digital bus may be used to transmit the software updates to digital amplifiers. For example, a controller area network (CAN) or optical bus, such as the MOST bus, could be used to update the software in the amplifier.

Unfortunately, the use of a digital bus for software updates is not always possible. For example, the amplifier may not support a digital bus. In addition, the vehicle may not have a digital bus. In these circumstances, there is no practical way of updating the amplifier's software short of removing the amplifier from the vehicle, which is a difficult and time consuming process. Therefore, a need exists for a system and method for updating the software of a digital amplifier without using a digital bus.

SUMMARY

This invention provides a system for updating the software of a digital audio amplifier without the use of a digital bus. The digital data used to update the amplifier's software is transmitted over analog audio channel(s) to the amplifier as encoded digital data on an analog signal.

The amplifier is adapted to switch between an audio mode and a reconfiguration mode. In the audio mode, the amplifier processes the analog signal(s) received over the audio channels for listening by a user. When in the reconfiguration mode, the amplifier decodes the analog signal(s) into digital instructions. These digital instructions may be processed by the amplifier to reconfigure the amplifier's operation.

The software update may be stored on audio media, such as a CD or tape. The audio media may contain several tracks, in which each track represents a different selectable configuration for the amplifier. To update the amplifier, the user may insert the audio media into an audio device and select the track with the desired configuration. By simply playing the track, encoded digital data on an analog signal may be transmitted to the amplifier. This analog signal may be reconstructed into digital instructions by the amplifier for reconfiguring the amplifier's operation.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
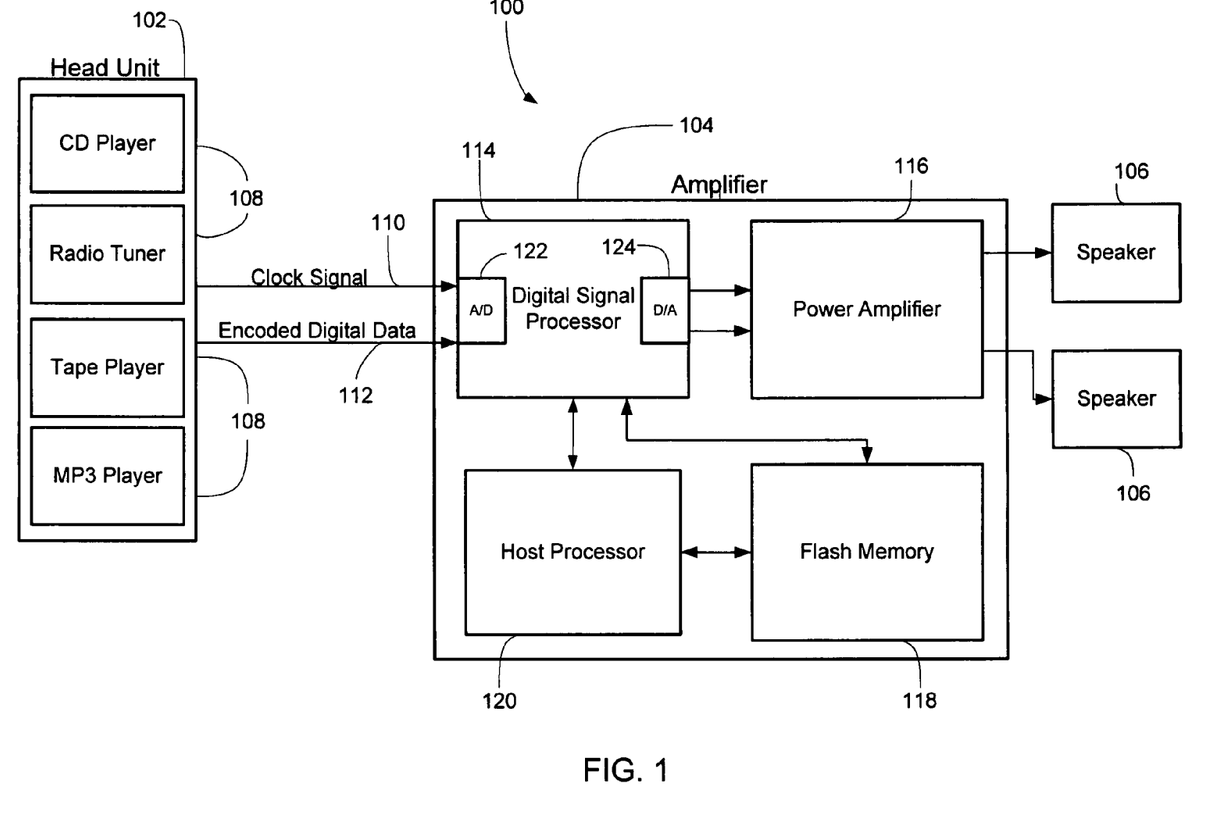
FIG. 1 is a block diagram of an example audio system.

FIG. 1 is an example vehicle audio system 100 with a head unit 102, an amplifier 104 and a plurality of speakers 106. The head unit 102 provides an audio signal to the amplifier 104. The amplifier 104 amplifies the signal to drive the set of speakers 106. The system may include additional audio components. For example, the system may include multiple amplifiers that each drive different sets of speakers.

The head unit 102 includes audio devices 108 for transmitting an audio signal to the amplifier 104. A single audio device or multiple audio devices may be provided with the head unit 102. In some examples, the audio devices may be integrated into the head unit 102. In other examples, the audio devices 108 may be separate from the head unit, but configured to communicate with the head unit 102. In the example system shown, the head unit 102 includes a CD player, radio tuner, tape player and MP3 player. The CD player may be a single disc player or a multi-disc changer. The radio tuner may receive AM, FM and satellite radio signals. The MP3 player may be capable of playing compressed audio files, such as MP3, AAC or WMA files.

The head unit 102 may have multiple output channels connected to input channels of the amplifier 104. In a 5.1 multi-channel audio system, for example, the head unit may have six output channels connected to an amplifier. In the example system shown, a first audio channel 110 and a second audio channel 112 provide audio communications between the head unit 102 and the amplifier 104. These channels 110 and 112 may represent the left channel and the right channel of the audio system. However, audio communications to reconfigure the operation of the amplifier 104, as described herein, may use a single channel to transmit encoded digital data on an audio signal for reconfiguring the operation of the amplifier 104. In other examples, three channels, four channels or more may each be used to transmit encoded digital data on an audio signal that may be used to reconfigure the operation of the amplifier 104.

The amplifier 104 may include a main processor, such as a digital signal processor ("DSP") 114, a power amplifier 116, a memory 118 and optionally a host processor 120. The DSP 114 may contain an analog to digital converter ("ADC") 122 that converts analog audio signals received by the amplifier 104 into digital data. Alternatively, the ADC may be a separate device. The DSP 114 may process the digital data based upon the operational configuration of the amplifier or other instructions. For example, the DSP 114 may adjust delay, equalization or other audio properties of the digital data. The DSP 114 may also include a digital to analog converter ("DAC") 124 to convert the digital data processed by the DSP 114 into an analog signal which is transmitted to the power amplifier 116. Alternatively, the DAC may be a separate device. The optional host processor 120 may be provided to control overall operation of the amplifier 104. If a host processor 120 is not included in the amplifier 104, the DSP 114 may provide processing capability for the operation of the amplifier 104. The memory 118 may be used for storing configuration settings and/or other data related to the operation of the amplifier 104.

The amplifier 104 may be configured to switch between an audio mode and a reconfiguration mode. In the audio mode, the amplifier 104 may drive the speakers 106 with the audio signals received from the head unit 102 so that the user can listen to the audio played through the speakers 106. In FIG. 1, for example, an analog audio signal may be received by the DSP 114 on the first audio channel 110 and the second audio channel 112 and converted to digital data by the ADC 122. The DSP 114 may process the digital data based upon certain configuration settings residing in the memory 118. For example, the DSP 114 may perform filtering of the data based on predetermined settings of the amplifier 104 to achieve certain audio characteristics. The DAC 124 on the DSP 114 may then convert the digital data to analog audio signals. The power amplifier 116 may receive the analog audio signals and drive the speakers 106. The speakers 106 will play the audio, such as music or an audio book, for the enjoyment of the user.

In the reconfiguration mode, however, digital instructions for reconfiguring the operation of the amplifier 104 are transmitted over the analog audio channel(s) using encoded digital data on analog signal(s). It should be appreciated that the digital instructions may be encoded or modulated into analog signal(s) using any modulation or encoding scheme. For example, frequency-shift keying ("FSK"), quadature phase modulation ("QPM") or phase shift keying ("PSK") could be used to modulate the digital instructions into analog signal(s). By way of another example, the encoding scheme described with reference to FIG. 2 may also be used.

The amplifier 104 is adapted to reconstruct the digital instructions from the encoded digital data on analog signal(s). By playing the analog signal(s), the head unit 102 transmits the analog signal(s) to the amplifier 104. The amplifier 104 may be configured to demodulate or decode the digital instructions from the analog audio signal(s). Any demodulation or decoding could be used. For example, the amplifier may demodulate the analog signal(s) using FSK, QPM or PSK demodulation. By way of another example, the decoding scheme described with reference to FIG. 3 could be used. However, it should be appreciated that any technique for transmitting digital data using analog signal(s) could be used to transmit the digital instructions. The amplifier 104 may be configured to demodulate the digital instructions from the analog audio signal using any demodulation method.

The encoded digital data on analog signal(s) may be transmitted on a single channel or multiple channels. For example, both the digital instructions and a clock signal may be encoded or modulated into a single analog signal and transmitted over a single channel. In such a system, the clock signal may be encoded in the digital data and extracted from the digital data upon receipt by the amplifier 104. The digital instructions may also be modulated or encoded into multiple analog signals that are transmitted on multiple channels, either simultaneously or sequentially. For example, the digital instructions may be transmitted on three, four or more channels.

A clock signal may be embedded in the encoded digital data on the analog signal that is sent on one or more audio channels. For example, both a clock signal and the digital instructions may be sent as a single analog signal on a single channel. By way of another example, the encoded digital data on an analog signal may be sent on multiple channels in which a clock signal is encoded into one of the channels. In other examples, a clock signal may be transmitted over a separate channel. For example, the encoded digital data on an analog signal may be sent on four channels and a clock signal may be sent on a fifth channel. In some examples, the clock signal may have a frequency in the audible human range. For example, the frequency may be up to 20.1 kHz. In some examples, the frequency of the clock signal may be above 3 kHz to 20.1 kHz. If FSK, QPM or PSK modulation were used, for example, the carrier frequency may be between 3 kHz to 20.1 kHZ.

In some environments, the head unit 102 may be connected to the amplifier 104 in an AC coupled path. For example, this type of connection is common in an audio system installed on a vehicle. In such environments, the encoding or modulation scheme is preferably capable of traveling through an AC coupled path. For example, the encoding/decoding scheme discussed below with respect to FIGS. 2 and 3 would be suitable when the head unit 102 is connected to the amplifier 104 in an AC coupled path. By way of another example, FSK, QPM or PSK could be used in an AC coupled environment. Other modulation or encoding schemes may be suitable for transmitting the analog audio signal through an AC coupled path.

In the example shown in FIG. 1, a first audio channel 110 and a second audio channel 112 connects the head unit 102 to the amplifier 104. In such a system, the amplifier 104 may receive a clock signal on the first audio channel 110 and encoded digital data on an analog signal representing digital instructions on the second audio channel 112. Instead, the amplifier may receive a clock signal on the second audio channel 112 and encoded digital data on an analog signal representing digital instructions on the first audio channel 110. By way of another example, both the clock signal and digital instructions may be transmitted as a single analog signal on the first audio channel 110 or the second audio channel 112. By way of a further example, the encoded digital data on an analog signal representing digital instructions may be transmitted on both the first audio channel 110 and the second audio channel 112 while the clock signal could be embedded in the encoded digital data on an analog signal either on the first audio channel 110 or the second audio channel 112. In some examples, the encoded digital data on an analog signal may be decoded with the clock signal to reconstruct digital instructions contained within the analog signal.

Figure 2:
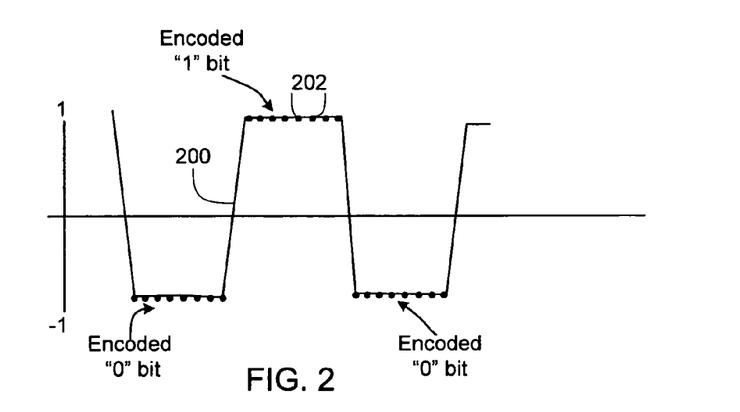
FIG. 2 is a graph illustrating an example analog audio signal representing digital instructions for changing the operation of an amplifier that may reside on an audio media.

FIG. 2 shows an example analog audio signal 200 encoded with the bit string "010." In the example shown, the signal 200 is a square wave that may oscillate between 1 and −1 volts. The periods above zero volts may represent a "1" bit while the periods below zero volts may represent a "0" bit. If the signal 200 were written to a CD, for example, multiple samples of each bit may be taken. In the example shown, eight samples were taken for each bit, as indicated by the dots 202 on FIG. 2. Accordingly, in this example, the frequency of the clock signal to decode with this signal (See FIG. 3) would be the sampling frequency divided by 8. If the sampling frequency were 44.1 kHz as would be typical of a CD, for example, the clock frequency would be 5.5125 kHz (i.e., 44.1 kHz divided by 8). It should be appreciated that various sampling rates could be used, such as 32 kHz, 46 kHz, 96 kHz and 192 kHz or other frequencies.

Figure 3:
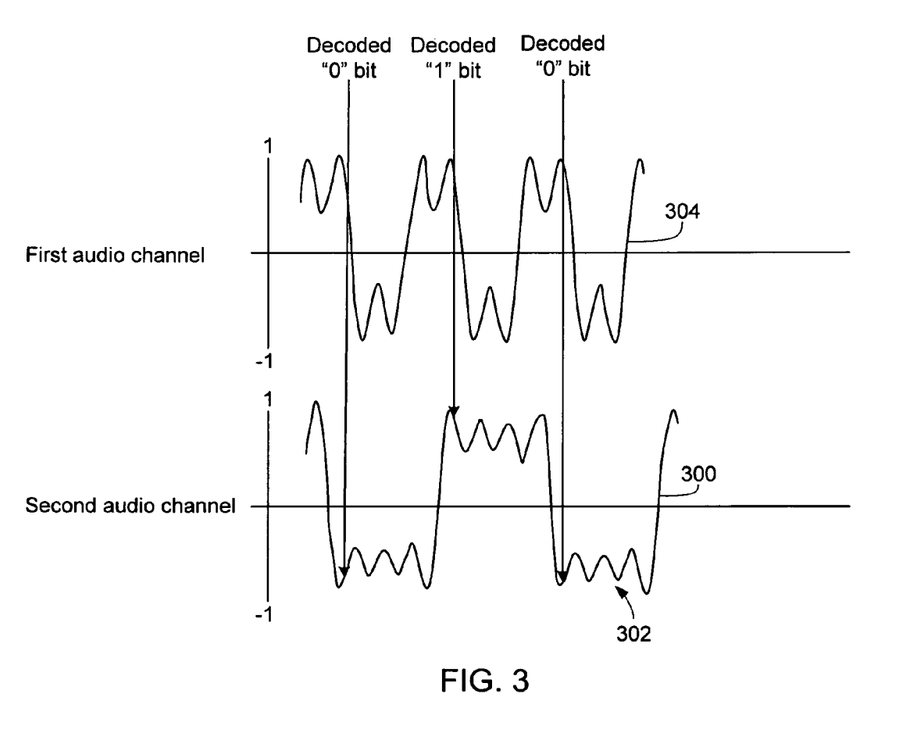
FIG. 3 is a graph illustrating the example analog audio signal of FIG. 2 after being passed through a digital to analog converter of a head unit, along with an example clock signal that may be used to decode digital instructions for changing the operation of an amplifier.

FIG. 3 shows an example of the encoded digital data on an analog signal 200 of FIG. 2 as an encoded digital data on an analog signal 300 received by the amplifier 104. The rippling 302 may be caused by the digital to analog converter that may be located in the head unit 102. A clock signal 304 that may be used to decode the encoded digital data on the analog signal 300 is also shown. In this example, the encoded digital data on the analog signal 300 may be decoded by comparing the location of the analog signal 300 at each rising edge or falling edge of the clock signal 304. In the example shown in FIG. 3, however, the analog signal 300 is compared with the falling edge of the clock signal 304. With this decoding method, the decoded bit string is "010" the same bit string shown in the example signal 200 of FIG. 2.

The DSP 114 may be used to reconstruct the digital data from the analog signal. The digital data may be collected into packets of digital instructions that may be processed by the amplifier 104 to change the operating configuration. The amplifier 104 may be configured to receive encoded digital data on an analog signal and/or a clock signal on any audio channel.

The amplifier 104 may be configured to compensate for unexpected signals. For example, if the amplifier 104 expects to receive a clock signal on the first audio channel 110, but a clock signal was actually received on the second audio channel 112, the amplifier 104 may be configured to be decoded with the second audio channel 112. By way of further example, if a clock signal and encoded digital data signal are redundantly sent on multiple channels, the amplifier 104 may be adapted to determine which channel provides the optimum signals.

The encoded digital data on an analog signal representing digital instructions for changing the operation of the amplifier 104 may be stored on an audio media, such as a CD or tape. The audio media may contain instructions for a single configuration or multiple configurations. If the audio media contains multiple configurations for the amplifier 104, each amplifier configuration may be stored on separate audio tracks. The audio media may also optionally contain verbal instructions to explain how to reconfigure the amplifier using the audio media.

Figure 4:
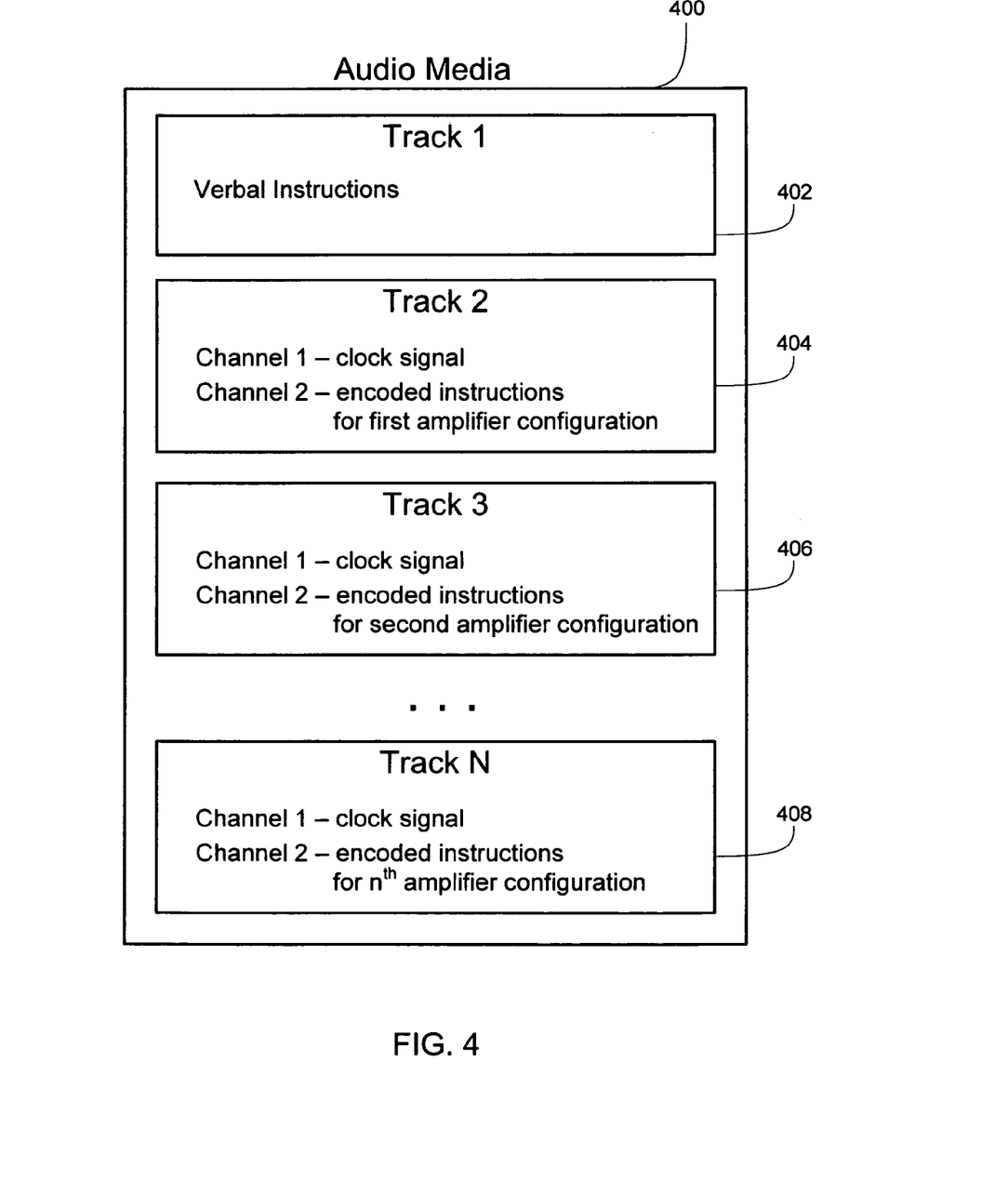
FIG. 4 is a block diagram of an example audio media that may be used to change the configuration of an amplifier.

In FIG. 4, there is shown an example audio media 400 with several audio tracks, track 1 (reference number 402), track 2 (reference number 404), track 3 (reference number 406) and Track N (reference number 408). In the example shown in FIG. 4, track 1 402 may include verbal instructions to explain how to use the audio media 400 to reconfigure the amplifier 104. Tracks 2, 3 and N 404, 406 and 408 may include analog audio signals representing digital instructions for changing the configuration of the amplifier 104. In the example shown, each of these tracks 404, 406 and 408 have a first channel with a clock signal and a second channel with encoded digital data on an analog signal representing instructions for changing the operation of the amplifier. As discussed herein, however, the encoded digital data on an analog signal and the clock signal may be encoded or modulated on a single analog signal and transmitted on a single channel. The user may select a particular amplifier configuration by selecting a track 404, 406 and 408 on the audio media 400. For example, if the user selects Track 2 404, the configuration settings provided in Track 2 404 will be loaded into the amplifier 104.

Figure 5:
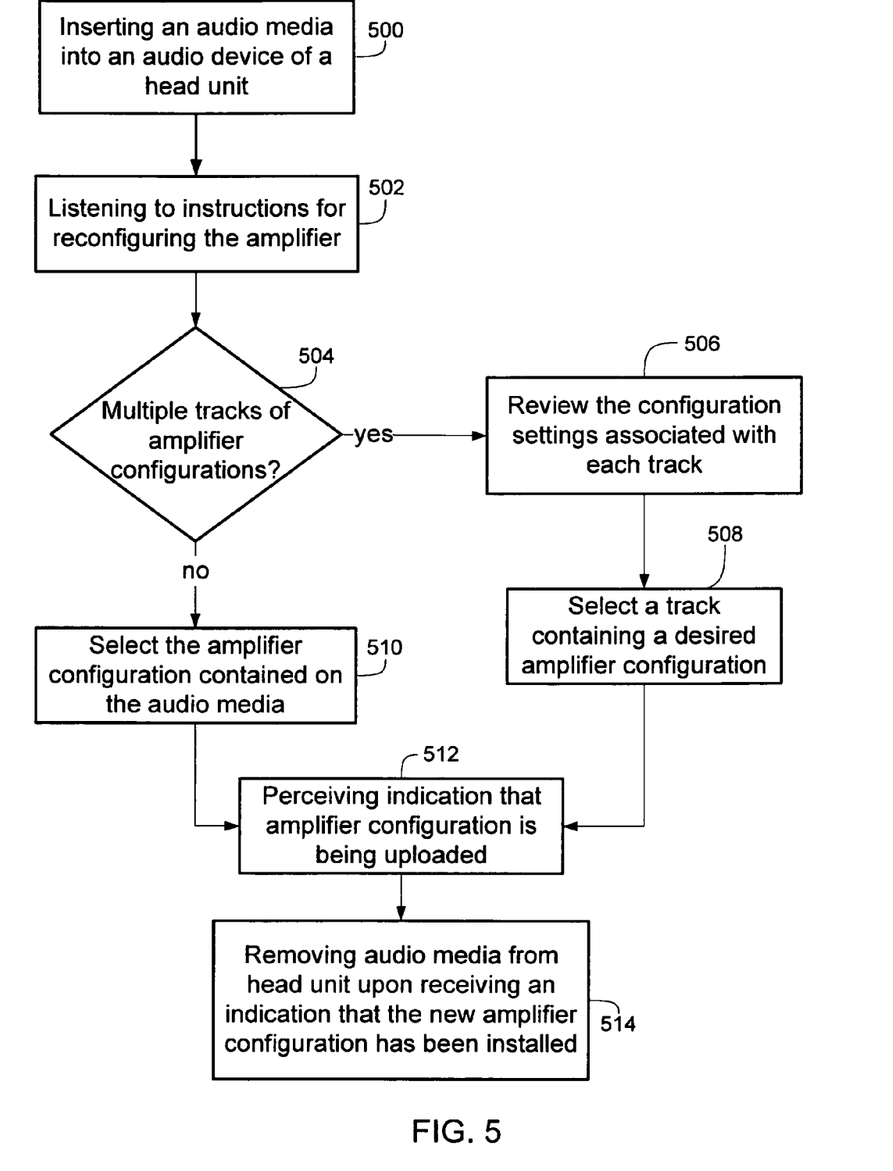
FIG. 5 is a flow chart of a method for changing the operation of an amplifier from a user's perspective.

FIG. 5 is a flow chart showing the actions that the user may take to change the amplifier configuration. In step 500, the user loads the audio media 400 containing the configuration instructions for the amplifier 104 into an audio device 108 of the head unit 102. For example, if the audio media 400 were a CD the user may insert a CD into the CD player of the head unit 102. However, the audio media 400 may not necessarily be physically inserted into the audio device 108. If the head unit 102 included a MP3 player, for example, the user may transfer the MP3 files containing the instructions for changing the amplifier configuration onto the MP3 player.

If the audio media 400 includes verbal instructions, the user may listen to the instructions to understand how to use the audio media 400 to change the amplifier configurations, as indicated by step 502. For example, the instructions may ask the user to change the volume setting on the head unit. In some cases, for example, the volume setting may be raised to increase the magnitude of the signal(s) sent to the amplifier.

As indicated by step 504, the user may determine whether the audio media contains multiple tracks of amplifier configurations. If the audio media contains multiple tracks, the user may review the configuration settings associated with each of the tracks as indicated by step 506. For example, the user may be able to listen to a track on the audio media explaining the settings associated with each track. By way of another example, printed material may be associated with the audio media that explains the functions of each track. By way of a further example, an audio device or the head unit may display information regarding the configurations associated with each track. As the user scrolls through each of the tracks, for example, a message may appear on the audio device of the head unit indicating the settings associated with the track, such as "Jazz," "Rock," "R&B," etc.

Once the user has decided upon a desired amplifier configuration, the user may select the desired amplifier configuration by selecting a track on the audio media 400 as indicated by step 508. For example, the audio media 400 may be a CD containing three tracks of digital instructions 404, 406 and 408, as shown in FIG. 4. For purposes of this example only, assume that the tracks 404, 406 and 408 each contain instructions for changing the equalizer of the amplifier 104. Each of these tracks 404, 406 and 408 may contain equalizer settings for a particular type of music. For example, track 1 404 may contain an equalizer setting configured for jazz, track 2 406 may be configured for classical music and track N 408 for rock. In this example, the user may select track 1 404 to change the equalizer settings of the amplifier for jazz music. Track 2 406 may be selected to change the equalizer settings for classical music and track 3 408 may be selected for rock. If the audio media contains a single amplifier configuration, the user may select the configuration as indicated by step 510.

The amplifier 104 may be configured to provide a signal to the user indicating that changes are being loaded onto the amplifier 104 as indicated by step 512. For example, the amplifier 104 may play a tone during the loading of the configuration setting. Instead, the amplifier 104 may mute the volume to prevent the analog audio signal from being played through the speakers 106. Once the changes to the amplifier 104 have been completed, the audio media may be removed from the head unit 102, as indicated by step 514. Upon completion, the amplifier 104 may provide a signal to the user that the audio media may be removed from the audio device 108. For example, the amplifier 104 may play a predetermined tone upon changing the amplifier's configurations.

Figure 6:
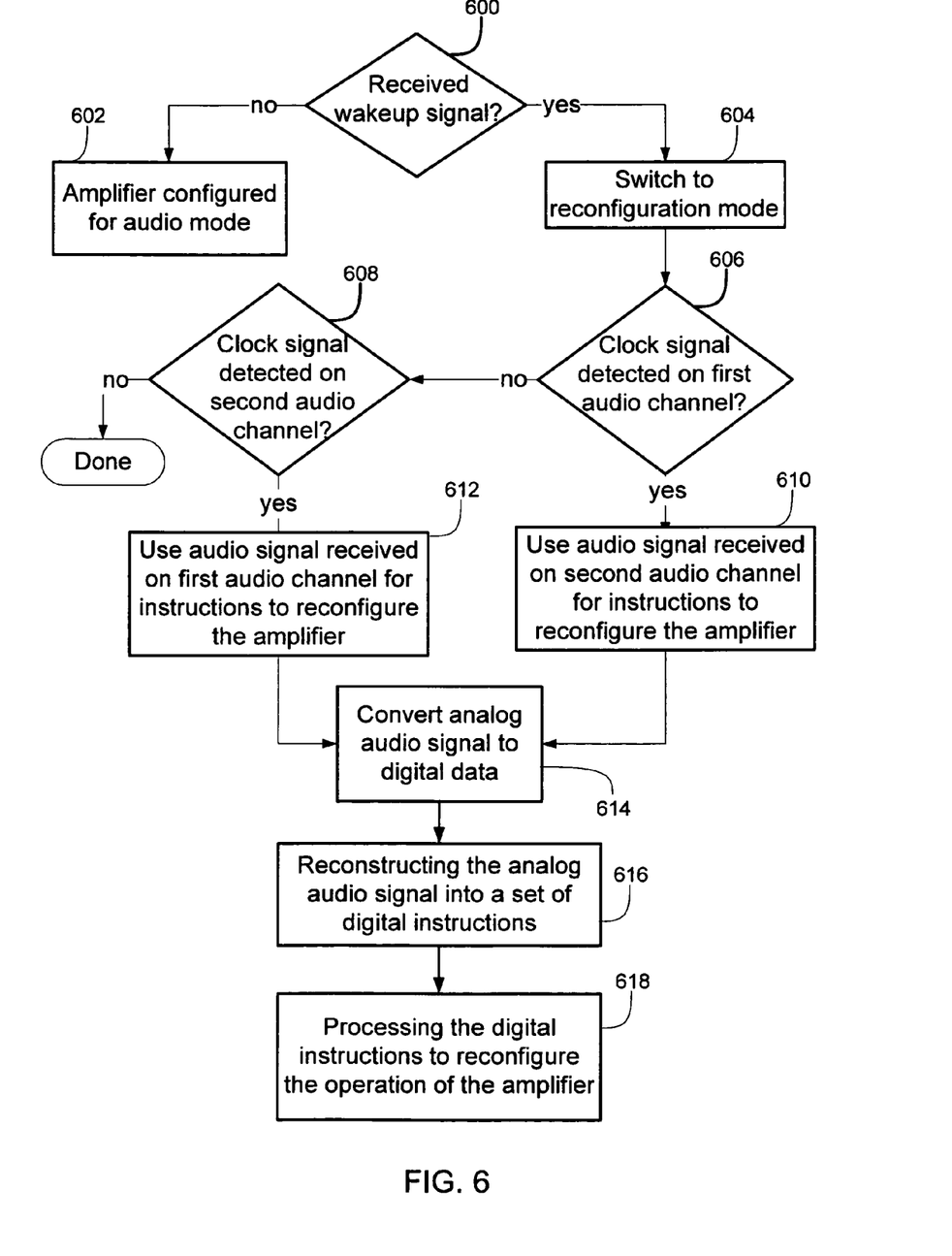
FIG. 6 is a flow chart of a method for changing the operation of an amplifier from an amplifier's perspective.

FIG. 6 is a flow chart showing the steps that may be taken by the amplifier 104 to change the configuration settings. As discussed above, the amplifier 104 may switch between an audio mode and a reconfiguration mode. In step 600, the amplifier may determine whether a wakeup signal has been received. If a wakeup signal has not been received, the amplifier 104 may remain in the audio mode as indicated by step 602.

Upon receiving a wakeup signal, the amplifier 104 may switch to the reconfiguration mode, as indicated by step 604. The wake up signal may be any signal that the amplifier 104 is capable of recognizing. For example, the wake up signal may be an audio signal outside the audible range, such as 20.1 kHz. This type of a wake up signal may be transmitted from an audio device on the head unit; however, the wake up signal would not likely be confused with any audio signal normally transmitted to the amplifier because of the high frequency.

The amplifier may then detect whether the clock signal is received on the first audio channel as indicated by step 606. In some examples, the amplifier may be configured to attempt to detect a clock signal on other audio channels. In a 5.1 multi-channel audio system, for example, the amplifier may attempt to detect a clock signal on a fifth audio channel. In further examples, as discussed herein, the clock signal may be embedded in the digital data. If the clock signal is not detected on the first audio channel, the amplifier may attempt to detect a clock signal on the second audio channel (step 608). If the clock signal is detected on the first audio channel, the amplifier may use the analog signal received on the second audio channel for instructions to reconfigure the amplifier (step 610). If the clock signal is received on the second audio channel, the amplifier may use the analog signal received on the first audio channel for instructions to reconfigure the amplifier (step 612). In examples where the amplifier has more than two channels, other channels may be used for instructions to reconfigure the amplifier.

The audio signal received from the head unit may be converted to digital data by the ADC of the DSP (step 614). As indicated by step 616, the digital bits encoded in the analog audio signal may be reconstructed into digital instructions. These digital instructions may be reconstructed using any decoding or demodulation technique. In the system shown in FIG. 1, for example, the analog signal received on the second audio channel 112 may be decoded with the clock signal received on the first audio channel 110. As shown in FIG. 3, the bits may be decoded by determining the position of the signal on the second audio channel with respect to the clock signal. These bits may be processed by the amplifier as digital instructions, as indicated by step 618.

Figure 7:
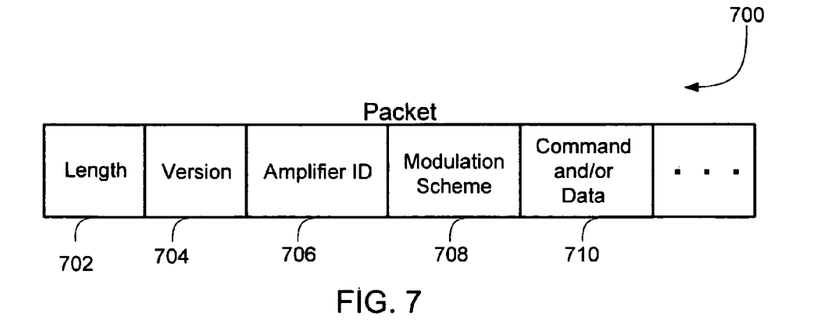
FIG. 7 is a block diagram of an example packet structure for communication with an amplifier.

The bits may be formed into packets based upon a predetermined packet structure. In FIG. 7, for example, the components of the packet 700 may include length 702, version 704, amplifier ID 706, modulation scheme 708 and command 710. The length component 702 of the packet 700 may represent the size of the packet 700, such as the total number of bits included in the packet 700. The version 704 may be used to represent the date on which the version of the packet 700 may be used. For example, if the date of the version is expired, for example, the amplifier 104 may return an error message to the user and not load the configuration changes. The amplifier ID 706 may represent the amplifier or class of amplifiers for which the packet 700 is intended. The modulation scheme 708 may be used to support different types of modulation, such as slow, medium and fast speeds. The command 710 may be used to instruct the amplifier 104 of an operation. For example, the command 710 may instruct the amplifier 104 to erase the memory 118. By way of another example, the command or data 710 may instruct the amplifier 104 to write data to the memory 118. By way of a further example, the command 710 may instruct the amplifier 104 to switch back to audio mode. The packet 700 may also contain error correction information (not shown).

In operation, the user may place an audio media 400 into an audio device 108 of the head unit 102. For example, the user may insert a CD into the CD player. Prior to loading a configuration into the amplifier 104, the user may optionally select a track containing verbal instructions for using the audio media 400. For example, the instructions may ask the user to increase the volume. By way of another example, the user may be asked to adjust the balance or fade settings. The user may then select a track on the audio media 400 containing the amplifier configuration that the user would like to load onto the amplifier 104.

Upon selecting a track, the amplifier 104 may receive a wake up signal to switch to the reconfiguration mode. The analog signal received from the head unit 102 may be converted to digital data by the ADC 122 of the amplifier 104. As discussed above, the analog signal may be multiple signals received on multiple audio channels or a single signal received on a single channel. Additionally, any encoding or modulation scheme may be used to transmit the digital instructions for changing the operation of the amplifier on an analog audio channel. In the system shown in FIG. 1, for example, both the clock signal 304 and encoded digital data on the analog signal 300 may be transmitted to the amplifier 104. The clock signal 302 may be used to decode the encoded digital data on the analog signal 300 into the digital data. The digital data may be collected into packets of digital instructions that may be processed by the amplifier 104. The instructions may include erasing the memory 118 of the amplifier 104 or writing new data or instructions to the memory 118, for example. During the loading process, the amplifier 104 may provide the user with an indication that the loading is still processing. After all instructions have been processed, the amplifier 104 may provide the user with an indication that the configuration has been loaded.

Figure 8:
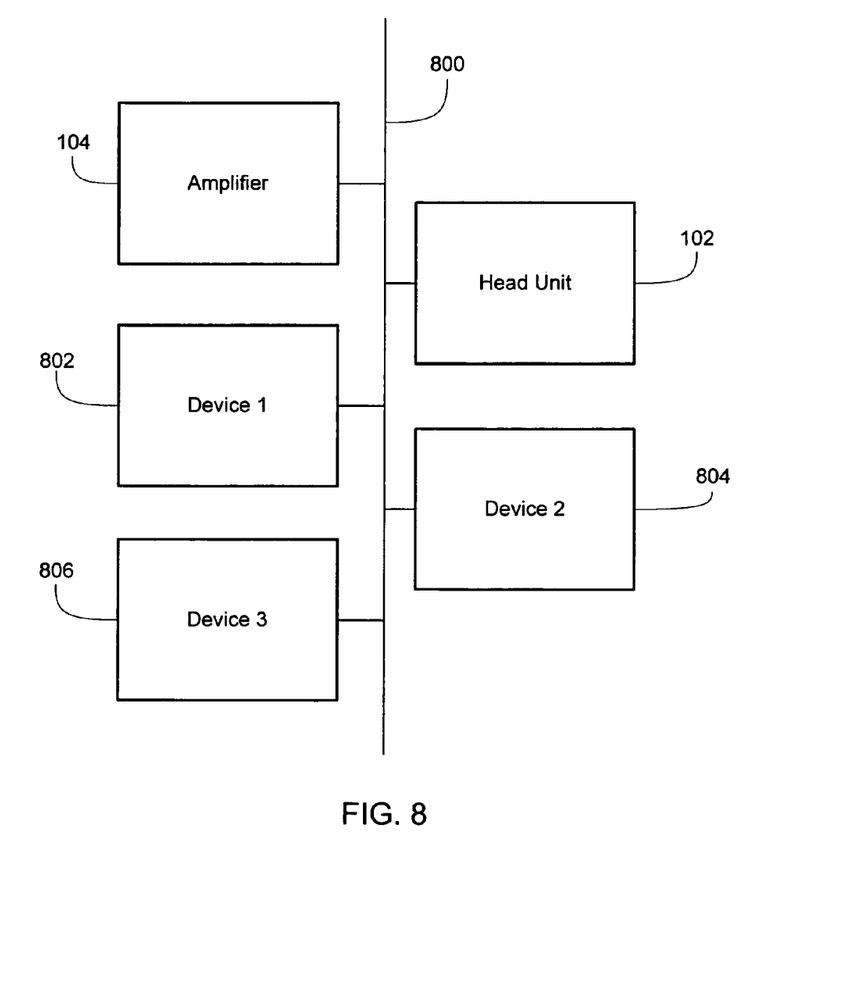
FIG. 8 is a block diagram of an amplifier connected on a bus with other devices.

If the amplifier 104 is connected on a bus, the amplifier 104 may be configured to pass the digital instructions on to another device on a bus. In the system shown in FIG. 8, for example, the amplifier 104 is connected on a vehicle bus 800 to the head unit 102, device 1 802, device 2 804 and device 3 806. For example, the bus 800 may be a controller area network (CAN) bus. As described above, the amplifier 104 may switch to a reconfiguration mode in which digital instructions may be reconstructed from encoded digital data on an analog signal. Instead of processing the digital instructions to reconfigure the amplifier 104, as discussed above, the amplifier 104 may forward the instructions to another device 802, 804 or 806 on the bus. For example, the packet 700 may contain a destination address for the packet 700. The amplifier 104 may transmit the packet 700 to the destination address on the bus 800.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. An audio system for a vehicle comprising:
an amplifier including an audio channel input, the amplifier including a processor adapted to switch between an audio mode and a reconfiguration mode,
a head unit including an audio channel output connected to the audio channel input of the amplifier, the head unit adapted to transmit an analog signal on the audio channel output to the audio channel input of the amplifier;
where the processor is configured to process an audio signal included in the analog signal received on the audio channel input in response to the processor being in the audio mode, the processed audio signal output by the amplifier on an amplifier output channel to drive a loudspeaker, and
where the processor is further configured to process the analog signal to reconstruct digital instructions encoded on the analog signal received on the audio channel input of the amplifier in response to the processor being in the reconfiguration mode, the processor further configured to reconfigure operation of the amplifier based on the digital instructions reconstructed from the analog signal.

2. The audio system of claim 1, where the processor switches to the reconfiguration mode in response to receiving a wake up signal from the head unit on the audio channel input.

3. The audio system of claim 2, where the wake up signal is an analog signal with a frequency above the human audible range.

4. The audio system of claim 2, where the wake up signal is an analog signal with a frequency above 20 kHz.

5. The audio system of claim 1, where the processor recovers a clock signal embedded in the analog signal received from the head unit, the processor using the clock signal to reconstruct the digital instructions from the analog signal.

6. The audio system of claim 1, where the amplifier further comprises a second audio channel input adapted to receive a clock signal when the processor is in the reconfiguration mode, the processor using the clock signal to reconstruct the digital instructions from the analog signal.

7. The audio system of claim 1, where the processor reconstructs the digital instructions from the analog signal using a demodulation scheme selected from the group consisting of frequency shift keying, phase shift keying and quadature amplitude modulation.

8. The audio system of claim 7, where a carrier frequency for the demodulation scheme is between 3 kHz to 20.1 kHz.

9. An audio system for a vehicle comprising:
a head unit including a first audio channel output and a second audio channel output; and
an amplifier including a first audio channel input connected to the first audio channel output of the head unit and a second audio channel input connected to the second audio channel output of the head unit,
the amplifier including a processor configured to process an audio signal included in analog signals received on the first audio channel input and the second audio channel input, and configured to reconstruct digital instructions encoded in the analog signals received on the first audio channel input and the second audio channel input, the processed audio signal output by the amplifier to drive a loudspeaker, and the digital instructions adapted to reconfigure the operation of the amplifier to process the analog signals containing the audio signal that is output by the amplifier to drive the loudspeaker.

10. The audio system as recited in claim 9, where the head unit is configured to transmit a clock signal to the first audio channel input, the clock signal included in the digital data.

11. The audio system as recited in claim 10, where the head unit is configured to transmit encoded digital data representative of the digital instructions on an analog signal to the second audio channel input.

12. The audio system as recited in claim 11, where the processor is configured to decode the encoded digital data on the analog signal transmitted to the second audio channel input using the clock signal transmitted to the first audio channel.

13. The audio system as recited in claim 12, where the processor is configured to convert the encoded digital data on the analog signal transmitted to the second audio channel input into instructions for changing at least one configuration setting of the amplifier.

14. The audio system as recited in claim 9, where the processor is responsive to a wake up signal from the head unit received on at least one of the first audio channel input and the second audio channel input to reconstruct digital instructions from analog signals received on the first audio channel input and the second audio channel input.

15. The audio system as recited in claim 14, where the wake up signal is above the audible human range.

16. The audio system as recited in claim 14, further comprising at least two speakers connected to an output of the amplifier, the amplifier configured to mute the output in response to the wake up signal.

17. A digital amplifier comprising:
an audio input;
an audio output;
memory configured to store operational parameters of a digital amplifier;
a power amplifier adapted to drive the audio output with an analog signal; and
a processor configured to process an audio signal received on the audio input, and include the audio signal in the analog signal used to drive the audio output, the processor further configured to reconstruct digital instructions encoded in the audio signal received on the audio input, the digital instructions adapted to change the operational parameters stored in the memory.

18. The digital amplifier as recited in claim 17, where the audio input has a first audio channel input and a second audio channel input, the processor being configured to reconstruct digital instructions from analog signals received on the first audio channel input and the second audio channel input for reconfiguring the operation of the digital amplifier.

19. The digital amplifier as recited in claim 18, where the processor is configured to receive a clock signal embedded in analog signals received on the first audio channel input and encoded digital data on analog signals received on the second audio channel input.

20. The digital amplifier as recited in claim 19, where the processor is configured to reconstruct the encoded digital data on the analog signals received on the second audio channel input using the clock signal.

21. The digital amplifier as recited in claim 17, where the digital instructions include instructions for the processor to erase the memory and write a new amplifier configuration to the memory.

22. The digital amplifier as recited in claim 20, where the processor is configured to convert the encoded digital data on the analog signal received on the second audio channel input into digital instructions to reconfigure operation of the digital amplifier.

23. The digital amplifier as recited in claim 17, where the processor is further configured to form the digital instructions into a plurality of data packets, each data packet having a header.

24. The digital amplifier as recited in claim 23, where the header includes a field representing the length of the data packet.

25. The digital amplifier as recited in claim 23, where the header includes a field representing an identification of the digital amplifier for which the digital instructions are intended.

26. The digital amplifier as recited in claim 23, where the header includes a field representing the version of the digital instructions.

27. The digital amplifier as recited in claim 23, where the header includes a field representing a modulation scheme for reconstructing analog signals received on the first audio channel input and the second audio channel input.

28. The digital amplifier as recited in claim 23, where the data packet includes a field representing a command to be performed by the processor.

29. The digital amplifier as recited in claim 17, where the processor is a digital signal processor.

30. The digital amplifier as recited in claim 18, where the processor is configured to reconstruct the digital instructions from the analog signals received on the first channel input and the second channel input in response to receiving a wake up signal on at least one of the first channel input and the second channel input.

31. The digital amplifier as recited in claim 30, where the wake up signal is an analog signal above the audible human range.

32. The digital amplifier as recited in claim 31, where the audio output is muted in response to the wake up signal.

33. A method for changing at least one configuration setting of a digital amplifier comprising:
    receiving an analog audio signal as an input on an amplifier audio input channel of a digital amplifier, the amplifier audio input channel configured to receive signals used to drive an audio channel output of the digital amplifier, the analog audio signal encoded with digital instructions representing instructions for reconfiguring the operation of the digital amplifier;
    reconstructing the analog audio signal into a set of digital instructions for changing at least one configuration setting of the digital amplifier; and
    processing the set of digital instructions to reconfigure the operation of the digital amplifier.

34. The method as recited in claim 33, where the amplifier audio input channel comprises a first amplifier audio input channel and a second amplifier audio input channel, and the receiving step includes receiving a first analog audio signal on the first amplifier audio input channel of the digital amplifier and receiving a second analog audio signal on the second amplifier audio input channel of the digital amplifier.

35. The method as recited in claim 34, where the first analog audio signal is a clock signal and the second analog audio signal is encoded digital data on an analog signal.

36. The method as recited in claim 35, where the reconstructing step includes converting the first analog audio signal and the second analog audio signal to digital data using an analog to digital converter.

37. The method as recited in claim 34, where the reconstructing step is performed by a digital signal processor.

38. The method as recited in claim 34, where the reconstructing step is performed in response to the digital amplifier receiving a wake up signal.

39. The method as recited in claim 34, further comprising the step of detecting whether the first analog audio signal is a clock signal.

40. The method as recited in claim 39, where the reconstructing step selects a channel used to decode responsive to the detecting step.

41. The method as recited in claim 34, further comprising the step of detecting a phase shift in the first analog audio signal and the second analog audio signal.

42. The method as recited in claim 33, where the reconstructing step compensates for a phase shift in the first analog audio signal and the second analog audio signal in response to the detecting step.

43. The method as recited in claim 33, further comprising the step of providing an audible indication during the processing step.

44. The method as recited in claim 33, further comprising the step of providing an audible indication upon completion of the processing step.

45. A method for changing at least one configuration setting of a digital device residing on a vehicle comprising:
    receiving an analog audio signal representing a set of digital instructions on an audio input channel of a digital amplifier, the audio input channel configured to receive signals processed to form an output of the digital amplifier used to drive a loudspeaker;
    reconstructing the set of digital instructions from the analog audio signal; and
    communicating the set of digital instructions to a destination device for changing at least one configuration setting of the destination device, the destination device being separate from and external to the digital amplifier.

46. The method as recited in claim 45, where the digital amplifier and the destination device are connected by a CAN bus.

47. The method as recited in claim 46, where the reconstructing step includes converting the analog audio signal to digital data using an analog to digital converter.

48. The method as recited in claim 47, where the reconstructing step is performed by a digital signal processor.

49. The method as recited in claim 45, where the set of digital instructions includes header information containing an address for the destination device.

50. A digital amplifier comprising:
    an audio input; and
    a processor configured to reconstruct digital instructions to reconfigure operation of the digital amplifier during a reconstruction mode, the digital instructions reconstructed by the processor from an analog signal received on the audio input; and
    the processor further configured to execute the digital instructions during the reconstruction mode to reconfigure amplification related processing by the digital amplifier of an analog audio signal received on the audio input, and
    during an audio mode, the processor further configured to process analog audio signals received on the audio input.

51. The digital amplifier as recited in claim 50, where the audio input has a first audio channel input and a second audio channel input, the processor further configured to reconstruct digital instructions for reconfiguring the amplification related processing by the digital amplifier from the analog signals received on the first audio channel input and the second audio channel input.

52. The digital amplifier as recited in claim 51, where the processor is configured to receive a clock signal on the first audio channel input and encoded digital data on one of the analog signals received on the second audio channel input.

53. The digital amplifier as recited in claim 50, where the processor is a digital signal processor.

54. The digital amplifier as recited in claim 50, where the audio input is configured as an audio input channel to receive the analog audio signal, the analog audio signal processed with the digital amplifier to create an amplified analog audio signal on an audio output channel of the digital amplifier, the amplified analog audio signal used to drive a loudspeaker.

* * * * *